US011180366B2

(12) United States Patent
Aimi et al.

(10) Patent No.: US 11,180,366 B2
(45) Date of Patent: Nov. 23, 2021

(54) METHODS FOR FORMING A MEMS DEVICE LAYER ON AN ACTIVE DEVICE LAYER AND DEVICES FORMED THEREBY

(71) Applicant: General Electric Company, Schenectady, NY (US)

(72) Inventors: Marco Francesco Aimi, Niskayuna, NY (US); Joleyn Eileen Brewer, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/827,251

(22) Filed: Mar. 23, 2020

(65) Prior Publication Data

US 2021/0292161 A1    Sep. 23, 2021

(51) Int. Cl.
*B81C 1/00* (2006.01)

(52) U.S. Cl.
CPC ...... *B81C 1/00523* (2013.01); *B81C 1/00444* (2013.01); *B81C 1/00468* (2013.01); *B81C 1/00476* (2013.01); *B81C 1/00484* (2013.01); *B81C 1/00492* (2013.01); *B81C 2201/0102* (2013.01); *B81C 2201/013* (2013.01); *B81C 2201/0105* (2013.01);
(Continued)

(58) Field of Classification Search
CPC .... B81C 2201/0105; B81C 2201/0107; B81C 2201/0108; B81C 2201/0109; B81C 1/00484; B81C 1/00492; B81C 1/00523; B81C 2201/013; B81C 1/00468; B81C 1/00476
See application file for complete search history.

(56) References Cited

U.S. PATENT DOCUMENTS 6,841,861 B2   1/2005  Brady
7,049,175 B2   5/2006  Schaper et al.
(Continued)

OTHER PUBLICATIONS

Oberhammer et al., "S-Shaped Film Actuator for Low-Voltage High-Isolation MEMS Metal Contact Switches", 17th IEEE International Conference on Micro Electro Mechanical Systems. Maastricht MEMS 2004 Technical Digest, pp. 637-640, Maastricht, 2004.
(Continued)

*Primary Examiner* — Yasser A Abdelaziez
(74) *Attorney, Agent, or Firm* — Christopher R. Carroll; The Small Patent Law Group LLC

(57) ABSTRACT

A method includes obtaining an active device layer. The active device layer has a first surface with one or more active feature areas. First portions of the active feature areas are exposed, and second portions of the active feature areas are covered by an insulating layer. A conformal overcoat layer is formed on the first surface. A base of a microelectromechanical systems (MEMS) device layer is formed on the conformal overcoat layer. The MEMS device layer is spatially segregated from the active feature areas by removing portions of the base of the MEMS device layer in one or more antiparasitic regions (APRs) that correspond to the active feature areas. Metal MEMS features are formed on the base of the MEMS device layer. Selected portions of the active feature areas are exposed removing portions of the conformal overcoat layer that overlay the active feature areas.

14 Claims, 11 Drawing Sheets

(52) U.S. Cl.
CPC ........... *B81C 2201/0107* (2013.01); *B81C 2201/0108* (2013.01); *B81C 2201/0109* (2013.01)

(56) References Cited

U.S. PATENT DOCUMENTS

| | | | |
|---|---|---|---|
| 7,221,033 B2 | 5/2007 | Lutz et al. | |
| 7,745,892 B1 | 6/2010 | Ivanov et al. | |
| 8,053,266 B2 | 11/2011 | Zhan et al. | |
| 8,432,007 B2 | 4/2013 | Leidl et al. | |
| 8,476,096 B2 | 7/2013 | Kohl et al. | |
| 9,324,733 B2 | 4/2016 | Rogers et al. | |
| 9,778,039 B2 | 10/2017 | Najafi et al. | |
| 9,954,263 B2 | 4/2018 | Lee et al. | |
| 10,326,200 B2 | 6/2019 | Iannotti | |
| 2004/0119125 A1* | 6/2004 | Gogoi | B81C 1/00476 257/414 |
| 2014/0125359 A1* | 5/2014 | El-Gamal | G01L 19/0092 324/664 |
| 2014/0264648 A1* | 9/2014 | Chu | G01C 19/56 257/415 |
| 2019/0115658 A1 | 4/2019 | Iannotti et al. | |

OTHER PUBLICATIONS

Girbau et al., "In-Plane Electrostatically-Actuated RF MEMS Switch Suspended on a Low-Resistivity Substrate", Proceedings of the 36th European Microwave Conference, pp. 1731-1734, 2006.

\* cited by examiner

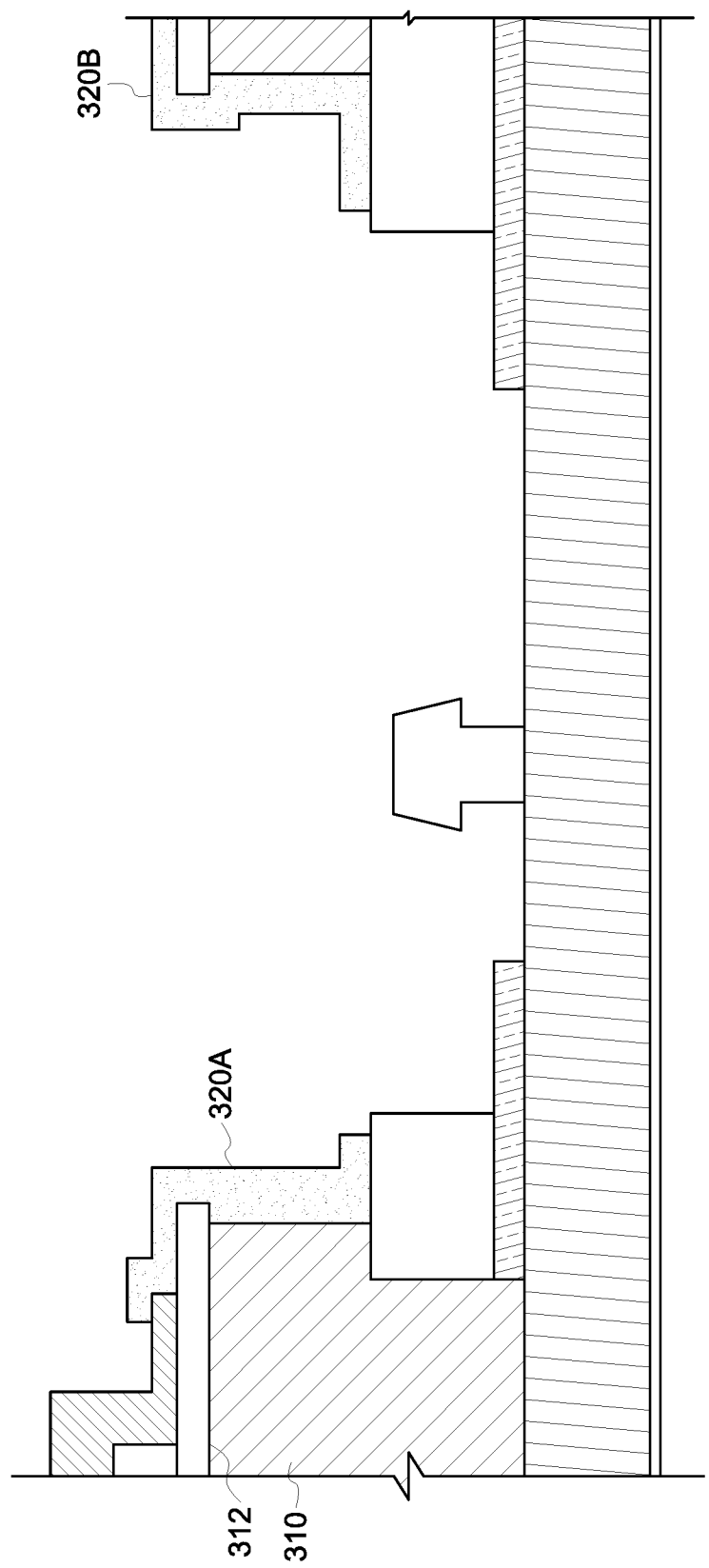

METHODS FOR FORMING A MEMS DEVICE LAYER ON AN ACTIVE DEVICE LAYER AND DEVICES FORMED THEREBY

BACKGROUND

There is an ever-increasing need for metal microelectromechanical systems (MEMS) devices integrated with active devices, such as semiconductor substrates bearing active features, to form various types of circuits. For example, a radio frequency (RF) module for a wireless device may employ tens of different MEMS switches to facilitate receiving, processing, and transmitting signals. Conventionally, MEMS switches are formed separately from the active device layer bearing active devices and later mounted to the active device layer to complete the circuitry associated with the MEMS switches. Separately forming then mounting the discrete MEMS switches to the active layer in conductive contact with the active features adversely impacts the cost and size of the resultant device package. Forming the metal MEMS devices directly on the active device layer would reduce the cost and size of the device package. In addition, the shorter routing paths provide lower losses than mounted discrete MEMS switch systems.

However, there are numerous limitations and challenges associated with forming MEMS device layers, bearing metal MEMS features, directly on the active device layers to form a device package. Active device layers may be formed using different technologies and materials than MEMS device layers bearing metal MEMS features. For example, portions of the active device layer may be damaged by the processes used to form the MEMS device layer. Additionally or alternatively, the MEMS device layer itself may have a parasitic interaction with the active features of the active device layer.

BRIEF DESCRIPTION

In one embodiment, a method includes obtaining an active device layer. The active device layer has a first surface with one or more active feature areas. First portions of the one or more active feature areas are exposed on the first surface. Second portions of the one or more active feature areas are covered by an insulating layer. A conformal overcoat layer is formed on the first surface of the active device layer using a cured polymer that is stable up to a select temperature. A base of a microelectromechanical systems (MEMS) device layer is formed on the surface of the conformal overcoat layer that faces away from the active device layer. The MEMS device layer is spatially segregated from the one or more active feature areas of the active device layer by removing portions of the base of the MEMS device layer in one or more antiparasitic regions (APRs) that correspond to the one or more active feature areas. Metal MEMS features are formed on the base of the MEMS device layer. Selected portions of the one or more active feature areas are exposed by selectively removing portions of the conformal overcoat layer that overlay the active feature areas of the active device layer.

In one embodiment, a device includes an active device layer. The active device layer has a first surface with one or more active feature areas. A conformal overcoat layer is disposed on the first surface of the active device layer. The conformal overcoat layer includes a cured polymer stable up to a select temperature. A MEMS device layer is disposed on a second surface of the conformal overcoat layer that faces away from the active device layer. The MEMS device layer includes a base and metal MEMS features disposed on the base. The MEMS device layer is spatially segregated from the one or more active feature areas by removing portions of the base of the MEMS device layer in one or more APRs that correspond to the one or more active feature areas of the active device layer.

BRIEF DESCRIPTION OF THE DRAWINGS

A full and enabling disclosure of the present disclosure is set forth in the specification, which refers to the appended Figures, in which:

FIG. 3A-3I are schematic, partial cross-sectional views illustrating the fabrication steps of the process of FIG. 2 in accordance with embodiments herein.

DETAILED DESCRIPTION

Figure 1:
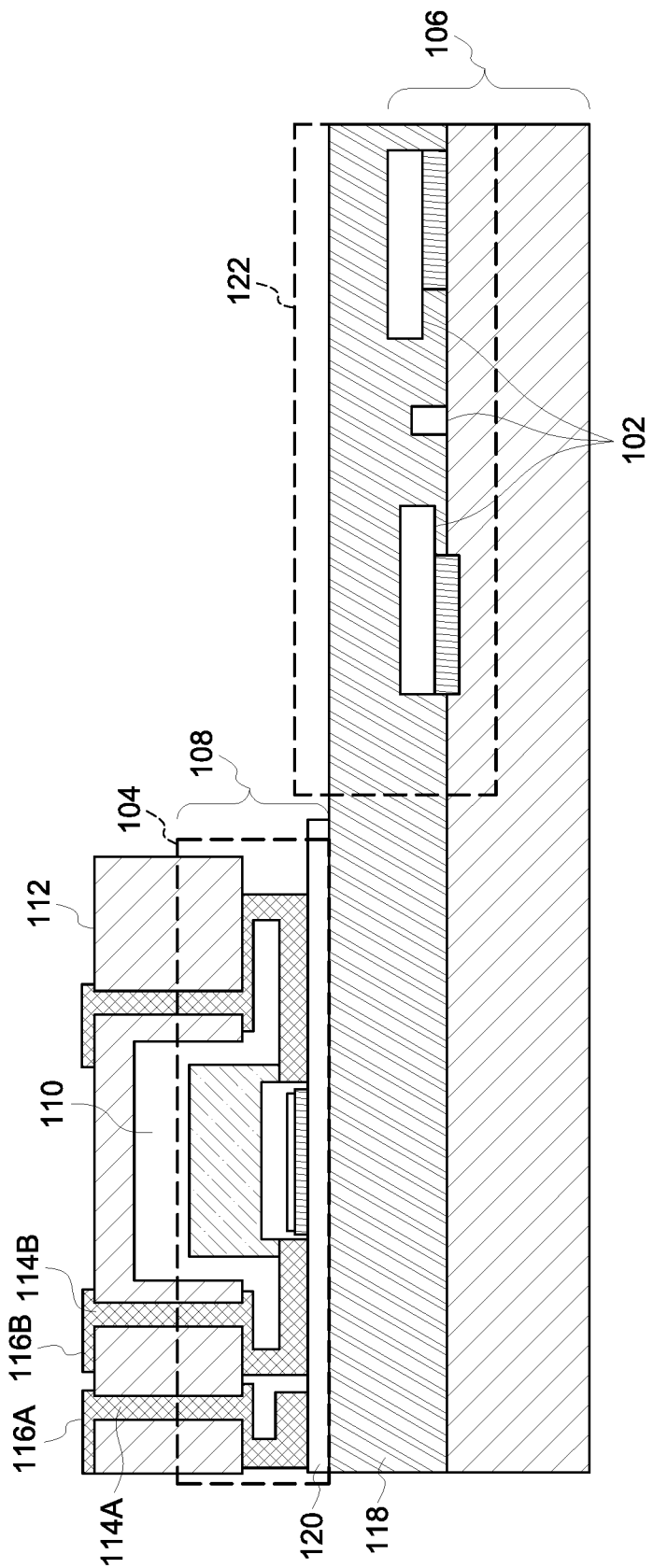
FIG. 1 is a schematic cross-sectional view of an example device package having active features that are spatially segregated with respect to the MEMS features in accordance with embodiments herein.

Reference now will be made in detail to embodiments of the present disclosure, one or more examples of which are illustrated in the drawings. Each example is provided by way of explanation of the present disclosure, and is not a limitation of the present disclosure. In fact, it will be apparent to those skilled in the art that various modifications and variations can be made in the present disclosure without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

In the present disclosure, when a layer is being described as "on" or "over" another layer or substrate, it is to be understood that the layers can either be directly contacting each other in one embodiment or have another layer or feature between the layers in another embodiment, unless expressly stated to the contrary. Thus, these terms are simply describing the relative position of the layers to each other and do not necessarily mean "on top of" since the relative position above or below depends upon the orientation of the device to the viewer.

Materials, such a metals and metal alloys, are discussed in the present disclosure using their common chemical abbreviation, such as commonly found on a periodic table of elements. For example, titanium is represented by its common chemical abbreviation Ti, tungsten is represented by its common chemical abbreviation W, silicon carbine is represented by its common chemical abbreviation SiC, and so forth.

As used herein, "substantially" refers to at least about 90% or more of the described group. For instance, as used herein, "substantially all" indicates that at least about 90% or more of the respective group have the applicable trait and "substantially no" or "substantially none" indicates that at least about 90% or more of the respective group do not have the applicable trait. As used herein, the "majority" refers to at least about 50% or more of the described group. For instance, as used herein, "the majority of" indicates that at least about 50% or more of the respective group have the applicable trait.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). The suffix "(s)" as used herein is intended to include both the singular and the plural of the term that it modifies, thereby including one or more of that term (e.g., "the refractory element(s)" may include one or more refractory elements). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

An antiparasitic region (APR) includes a region associated with an active feature area of an active device layer within which a MEMS device layer, or a portion thereof, interferes with the performance of active features in the active feature area in a manner and to an extent that falls below a threshold value (e.g., femtofarad or less leakage based on the active feature). A MEMS device layer, or a portion thereof, outside of the APR will not interfere with the performance of the active features in the active feature area in a manner and to an extent that falls below the threshold value. The APR includes an extrusion of substantially all of the area of an active feature area of a first surface of the active device layer that extends along a direction that is orthogonal to the first surface of the active device layer to at least the base of the MEMS device layer. For example, the MEMS device layer or a portion thereof (e.g., the base) may interfere with the performance of the active feature by, e.g., causing leakage, in the case of a conductive MEMS device layer, and/or parasitic capacitance, in the case of a dielectric MEMS device layer, when it extends into the APR. In another example, the MEMS device layer or a portion thereof (e.g., the base) that does not extend into the APR does not interfere with the performance of the active feature by, e.g., causing leakage, in the case of a conductive MEMS device layer, and/or parasitic capacitance, in the case of a dielectric MEMS device layer.

The present disclosure generally relates to methods for spatially segregating a MEMS device layer from active features of an active device layer, along with devices formed thereby. Such methods and devices enable the creation of higher performance RF circuits by reducing or eliminating signal transmission losses due to parasitic interactions between MEMS device layers (e.g., switch matrix layers and the like) and the active features of active device layers (relative to other methods and devices). Parasitic interactions between dielectric portions of MEMS device layers include parasitic capacitance and between conductive portions of MEMS device layers include leakage. Parasitic interactions between a MEMS device layer and active features of an active device layer are reduced or eliminated by removing portions of a base (or barrier layer) of the MEMS device layer in APRs corresponding to active feature areas of a first surface of the active device layer in order to spatially segregate the MEMS device layer from the active features disposed in the active feature areas as discussed further below.

FIG. 1 illustrates a schematic cross-sectional view an example device package 100 used to monolithically integrate and package one or more active features 102 and one or more metal MEMS features 104 in accordance with embodiments herein. Device packages generally include one or more active features 102 formed in an active device layer 106. The active features 102 are in conductive contact with one or more metal MEMS features 104 formed in a MEMS device layer 108 to complete a circuit or a portion of a circuit. The metal MEMS features 104 generally have a cavity or air gap or gas cavity 110 surrounding the free-standing metal MEMS features. The air gap 110 is formed by a cap or barrier layer 112 imposed on the surface of the MEMS device layer 108 at a boundary surrounding one or more of the metal MEMS features 104. The cap 112 provides mechanical, electrical, chemical, and/or environmental protection for the metal MEMS features 104. A plurality of electrical feedthroughs 114A, 114B may, in some instances, extend from inside of the cavity to the outside (through or under the cap 112) to guide electrical signals from outside to inside or vice-versa. Contacts 116A, 116B formed on the exterior of the device package 100 in conductive contact with electrical feedthroughs 114A, 114B generally facilitate connection of the device package 100 to external points or terminals. After packaging the one or more active features 102 and one or more metal MEMS features 104, the device package 100 may then be attached to a circuit board or system in a variety of unique and different approaches, as is discussed hereinafter.

The active features 102 are formed in an active device layer 106. The active device layer includes various substrates, active components, contacts for these components, and interconnects between these components. The active device layer 106 may be formed using semiconductor, CMOS (complementary metal oxide-semiconductor), and MEMS fabrication techniques. The active device layer 106 may be made of materials appropriate for a particular active device features or systems. Exemplary materials include, but are not limited to silicon, silicon compounds, germanium, germanium compounds, gallium, gallium compounds, indium, indium compounds, or other semiconductor materials and/or compounds. In addition, the active device layer 106 can include non-semiconductor substrate materials, including any dielectric materials, metals (e.g., titanium, gold, copper, and aluminum), or ceramics or organic materials found in printed wiring boards, for example. In one example, the active device layer 106 may be formed on a gallium nitride (GaN) substrate. In an additional or alternative example, the active features 102 may be three terminal active devices formed by a source, a gate, and a drain.

A conformal overcoat layer 118 is disposed between portions of a first surface of the active device layer 106 and a base 120 of the MEMS device layer 108. The conformal overcoat layer 118 is patterned to remove select portions over select areas of the active feature areas of the first surface of the active device layer 106. The conformal overcoat layer 118 is formed from a polymer material. The polymer material is a dielectric material (e.g., Avatrel®, polyimide, SU8) that, when cured, is stable up to a select temperature and can be selectively removed subsequent to forming the MEMS device layer 108. The select temperature is greater than temperatures associated with forming the MEMS device layer (e.g., 300 degrees Celsius).

The MEMS device layer 108 includes a base 120 and metal MEMS features 104 disposed on the base. The MEMS device layer 108 is spatially segregated from one or more active feature areas of the active features 102 by removing portions of the base 120 of the MEMS device layer 108 in one or more antiparasitic regions (APRs) 122 that correspond to the one or more active feature areas of the active features 102 of the active device layer 106. The MEMS features 104 are formed in a MEMS device layer 108. The base 120 of the MEMS device layer 108 is disposed on the conformal overcoat layer 118. The base 120 may be a dielectric material (e.g., having an electrical resistance of greater than 100 kOhm/square) or a conductive material. If using a conductive material, the base must be removed from the active region after the fabrication of the MEMS device layer. The base 120 includes at least one of silicon carbide (SiC), silicon nitride (SiN), titanium nitride (TiN), or polysilicon (polySi). Metal MEMS features 104 are disposed on the base 120. In one example, spatially segregating the MEMS device layer 108 from the active feature areas of the active features 102 includes spacing the MEMS device layer 108 far enough from the active feature areas that the operation of the presence and/or operation of the MEMS device layer 108 does not impact the operation of the active features 102. Additionally or alternatively, spatially segregating the MEMS device layer 108 from the active feature areas of the active features 102 includes spacing the MEMS device layer 108 far enough from the active feature areas that the operation of the presence and/or operation of the MEMS device layer 108 does not impact the operation of the active features 102 in a manner or to an extent that a select operational parameter (e.g., insertion loss, isolation, impedance, etc.) of the active features 102 is reduced to 90% or less of the operational parameter for an unaffected active feature. Spatial segregation includes spatially segregating the MEMS device layer 108 from the active features 102 (e.g., on the order of microns) in a plane extending parallel to the first surface of the active device layer 106 Optionally, spatial segregation may further include spatially segregating the MEMS device layer 108 from the active features 102 in a direction orthogonal to the first surface of the active device layer 106 based on the MEMS device layer overlaying the active features 102.

The electrical feedthroughs 114A, 114B and contacts 116A, 116B are formed from conductors such as metals and/or metal alloys, subject to appropriate considerations such as adhesion and thermal properties.

As previously stated, the cap 112 surrounding the cavity 110 provides mechanical, electrical, chemical, and/or environmental protection for the metal MEMS features 104. Depending on the particular type of device or the particular application, different types of protection may be desirable. Generally, the cavity 110 is an enclosed region containing a select gas and, in some embodiments, the cavity 110 is under vacuum conditions. The metal MEMS features 104 are packaged to ensure protection of the metal MEMS features 104 from the ambient working environment. For example, one type of protection provides protection from interference from other mechanical structures or objects to ensure structural integrity of the metal MEMS features 104. In this type of enclosure, the cap 112 should be made of a material that can withstand the conditions of a particular operating environment. Another type of protection is against exposure to oxygen or water (e.g., a hermetic enclosure). For hermetic protection, the cap 112 may be made of a material that provides an airtight seal around the cavity 110.

In accordance with one embodiment of the present disclosure, a process for forming a MEMS device layer on an active device layer is discussed in regard to FIG. 2 and FIGS. 3A-3G. It should be noted that for clarity, some portions of the fabrication process of the device package 100 are not included in FIG. 2 and only the portions of the device package 100 proximate one active feature area of the active feature layer are illustrated in FIGS. 3A-3G. As such, the following fabrication process is not intended to be an exhaustive list that includes all steps required for fabricating the device package 100. In addition, the fabrication process is flexible because the process steps may be performed in a different order than the order illustrated in FIG. 2 or some steps may be performed simultaneously.

Optionally, the one or more APRs may include extrusions of substantially all of each area of the one or more active feature areas of the first surface of the active device layer that extend along a direction that is orthogonal to the first surface of the active device layer to at least the base of the MEMS device layer.

Optionally, the conformal overcoat layer may include a cured polymer that is selectively removable by oxygen plasma etching.

Optionally, the first portions of the one or more active feature areas may be exposed on the first surface and second portions of the one or more active feature areas may be covered by an insulating layer.

Optionally, the device may include via holes extending through the conformal overcoat layer that expose selected portions of each of the one or more active feature areas on the first surface of the active device layer.

Optionally, the device may include a cap layer coupled to the MEMS device layer.

Figure 2:
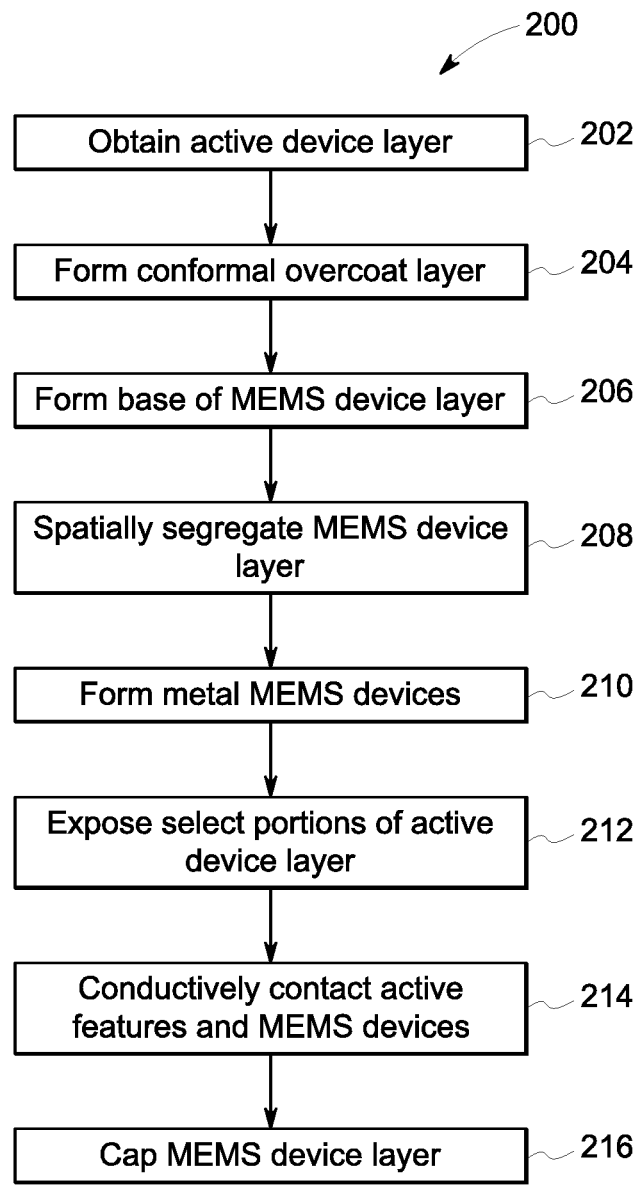
FIG. 2 is a flowchart describing an example process for fabricating the device package of FIG. 1 in accordance with embodiments herein.
Figure 3A:
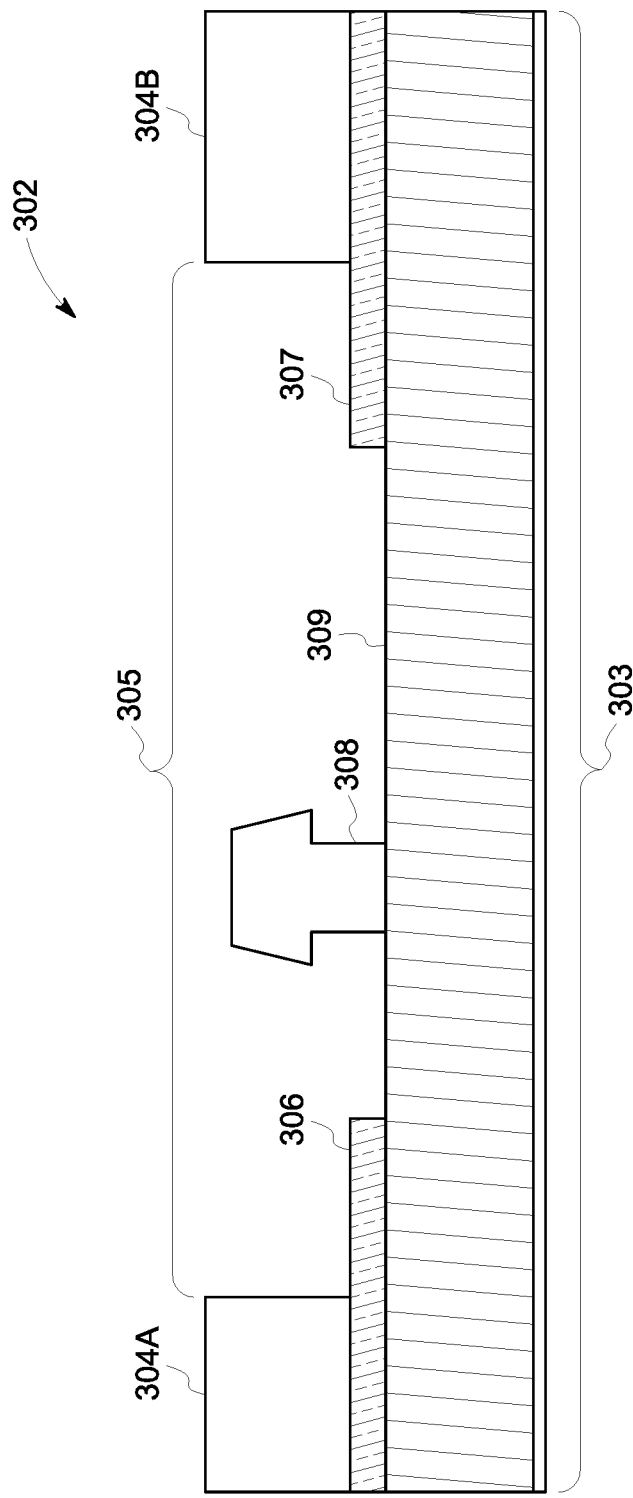

Referring now to FIGS. 2 and 3A, the process 200 begins by obtaining an active device layer 302. The active device layer 302 includes various active components, contacts for these components, and interconnects between these components. The active device layer 302 has a first surface with one or more active feature areas 303. First portions (represented by conductive pads 304A and 304B) of the one or more active feature areas 303 may be exposed on the first surface and second portions 305 of the active feature areas 303 may be covered by an insulator 309. In one example, the active feature area 303 may include a three terminal active device formed by a source 306, a gate 308, and a drain 307. Conductive pads 304A and 304B conductively contact, respectively, the source 306 and the drain 307 of the active feature area 303 and are exposed on the first surface of the active device layer 302.

Figure 3B:
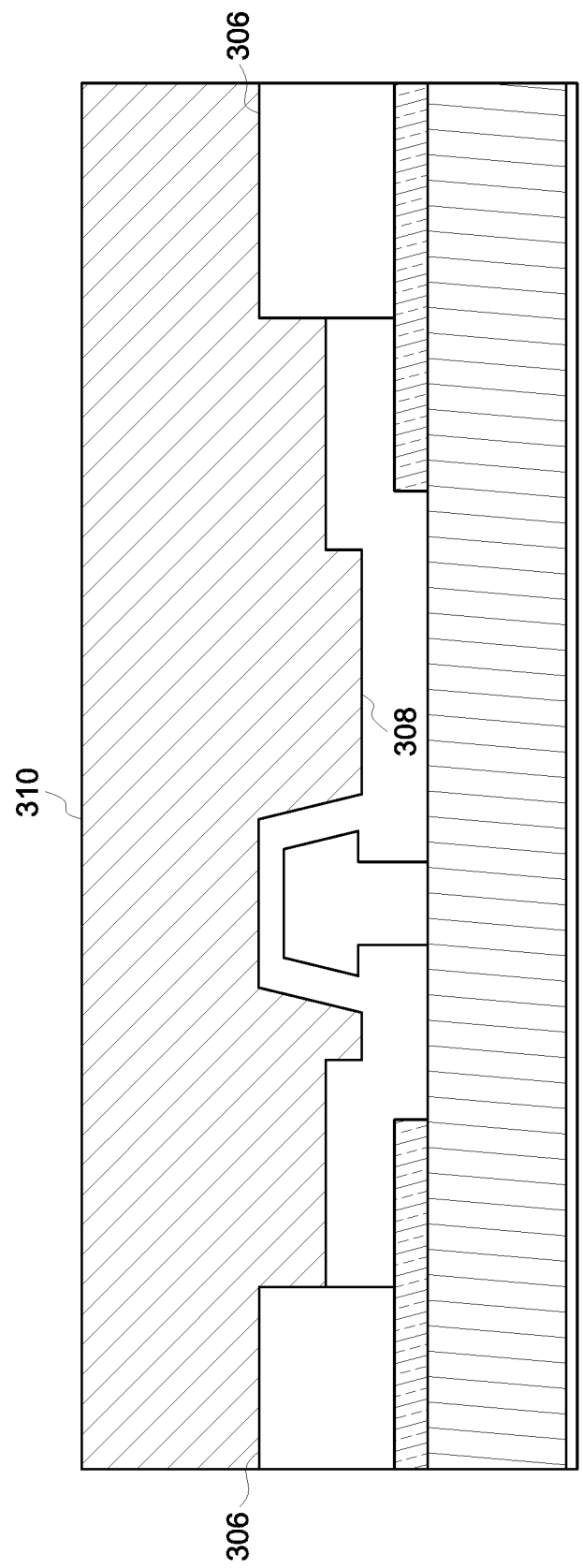

At 204, a conformal overcoat layer 310 is formed on the first surface of the active device layer 302 as illustrated in FIG. 3B. Uncured polymer material is applied to conform to the first surface of the active device layer 302. The polymer material may be deposited onto the active device layer 302 to a select height orthogonal to the first surface of the active device layer 302 using techniques such as, for example and without limitation, spin coating, doctor-blading, sputtering, lamination, screen or stencil-printing, melt dispensing, chemical vapor deposition (CVD), and plasma-based deposition systems. The polymer material may be planarized, either integral with the deposition process or in addition to the deposition process, and cured. The polymer material is a dielectric material (e.g., Avatrel®, polyimide, SU8) that, when cured, is stable up to a select temperature and can be selectively removed subsequent to forming the MEMS device layer. The select temperature is greater than temperatures associated with forming the MEMS device layer (e.g., 300 degrees Celsius). In one example, the conformal overcoat layer 310 is formed by spin coating an uncured polyimide onto the first surface of the active device layer 302 to the select height and then curing the polyimide.

Figure 3C:
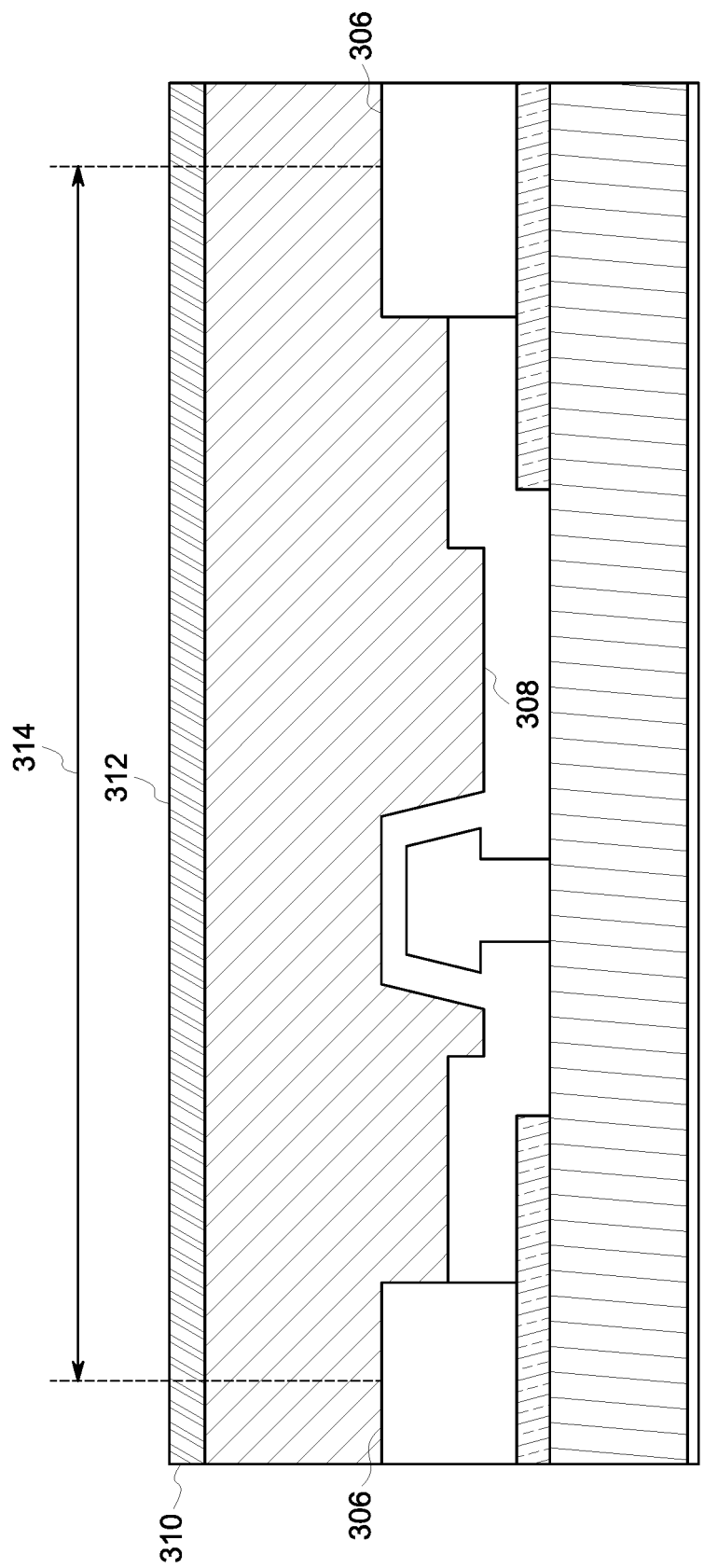

At 206, a base 312 of the MEMS device layer is formed on the conformal overcoat layer 310 on the surface of the conformal overcoat layer 310 opposite the active device layer 302 as illustrated in FIG. 3C. The base 312 may be formed on the conformal overcoat layer 310 by depositing a base material to a select height orthogonal to the first surface of the active device layer 302 using, for example and without limitation, suitable patterning and chemical vapor deposition (CVD) and/or physical vapor deposition (PVD) techniques (e.g., sputtering). The base 312 of the MEMS device layer may be a barrier layer that prevents outgassing of and/or improves adhesion of the subsequently formed metal MEMS features 318. The base 312 may be a dielectric material (e.g., having an electrical resistance of greater than 100 kOhm/square) or a conductive material. If using a conductive material, the base must be removed from the active region after the fabrication of the MEMS device layer. The base 312 includes at least one of silicon carbide (SiC), silicon nitride (SiN), titanium nitride (TiN), or polysilicon (polySi). In one example, the base 312 is formed by sputtering SiC to the select height.

Figure 3D:
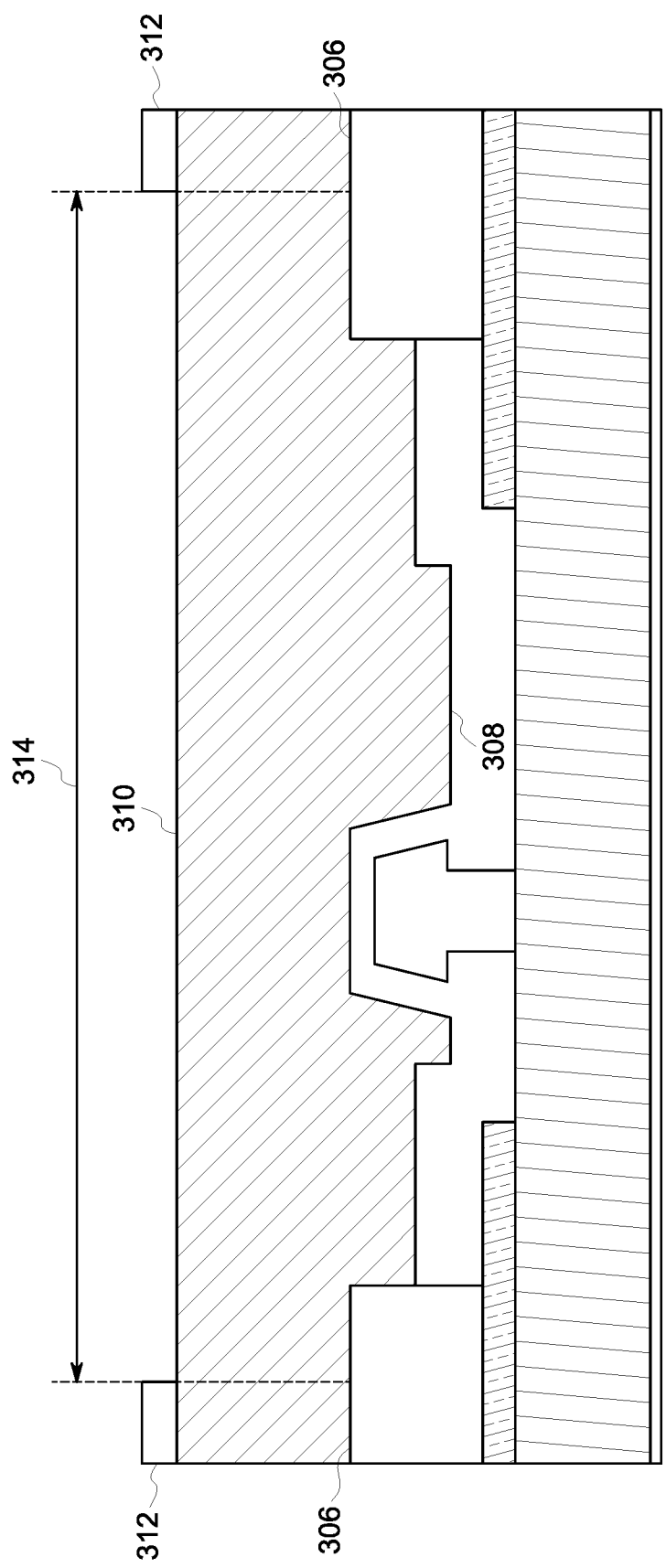

At 208, the MEMS device layer is spatially segregated from the one or more active feature areas 303 of the active device layer 302 by removing portions of the base 312 in one or more antiparasitic regions (APRs) 314 that correspond to the one or more active feature areas 303 as illustrated in FIG. 3D. Removing portions of the base 312 in one or more APRs 314 is accomplished by using any suitable selective etching techniques used in MEMS fabrication processes suited for etching the base material. The one or more APRs 314 include extrusions of substantially all of each area of the one or more active feature areas of the first surface of the active device layer that extend along a direction that is orthogonal to the first surface of the active device layer 302 to at least the base 312 of the MEMS device layer. In one example, removing portions of a base 312 (e.g., SiC) in one or more APRs 314 is accomplished by selective plasma etching techniques.

Figure 3E:
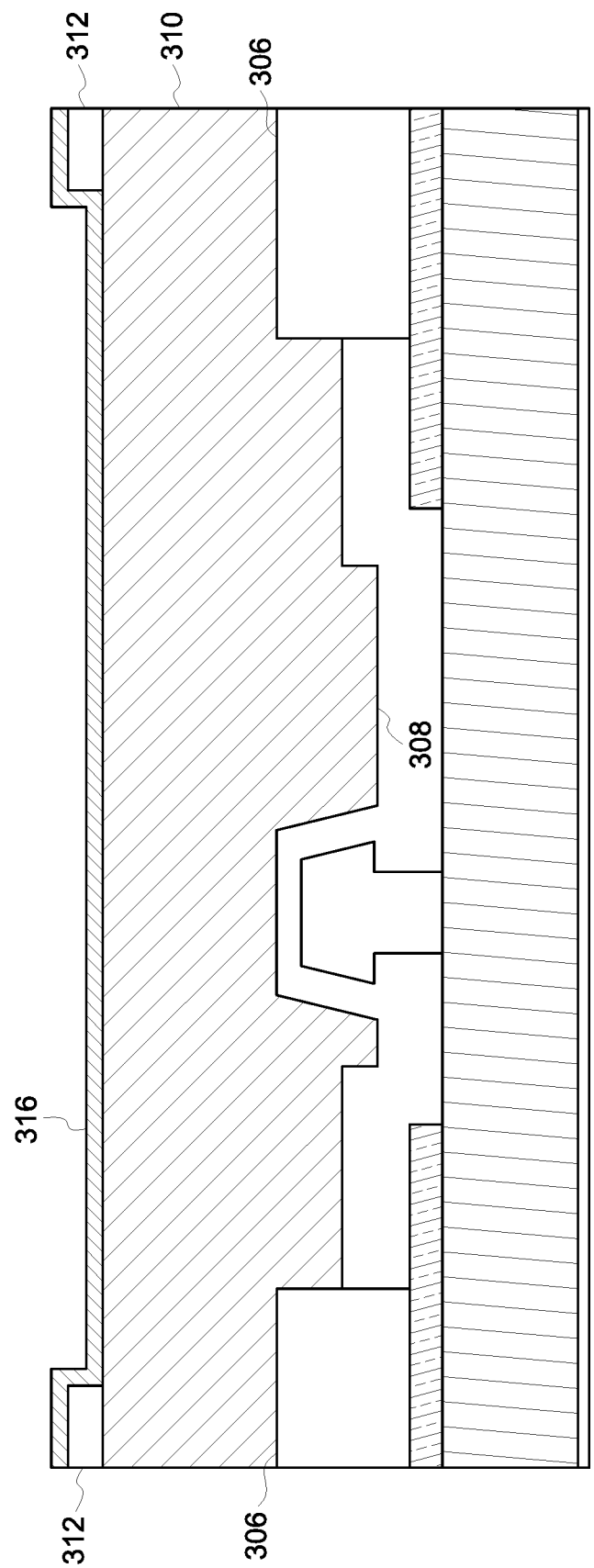

Optionally, a protective layer 316 is formed on at least the portions of the conformal overcoat layer 310 exposed by removing portions of the base 312 as illustrated in FIG. 3E. The base 312 may be formed by depositing and patterning a protective layer material to a select height orthogonal to the first surface of the active device layer 302 using, for example and without limitation, suitable CVD and/or PVD techniques (e.g., sputtering). The protective layer 316 protects the conformal overcoat layer 310 from subsequent steps used to form the metal MEMS features 318 on remaining portions of the base 312, such as buffered oxide etching and the like. For example, the conformal overcoat layer 310 may hold up well under most fabrication steps but may have an etch rate for an etchant used in forming the metal MEMS features 318. The protective layer 316 is selected to be unaffected by the etchant. In one example, the etchant used in forming the metal MEMS features 318 includes hydrofluoric acid or salts thereof and the protective layer is formed from titanium-tungsten (TiW).

Figure 3F:
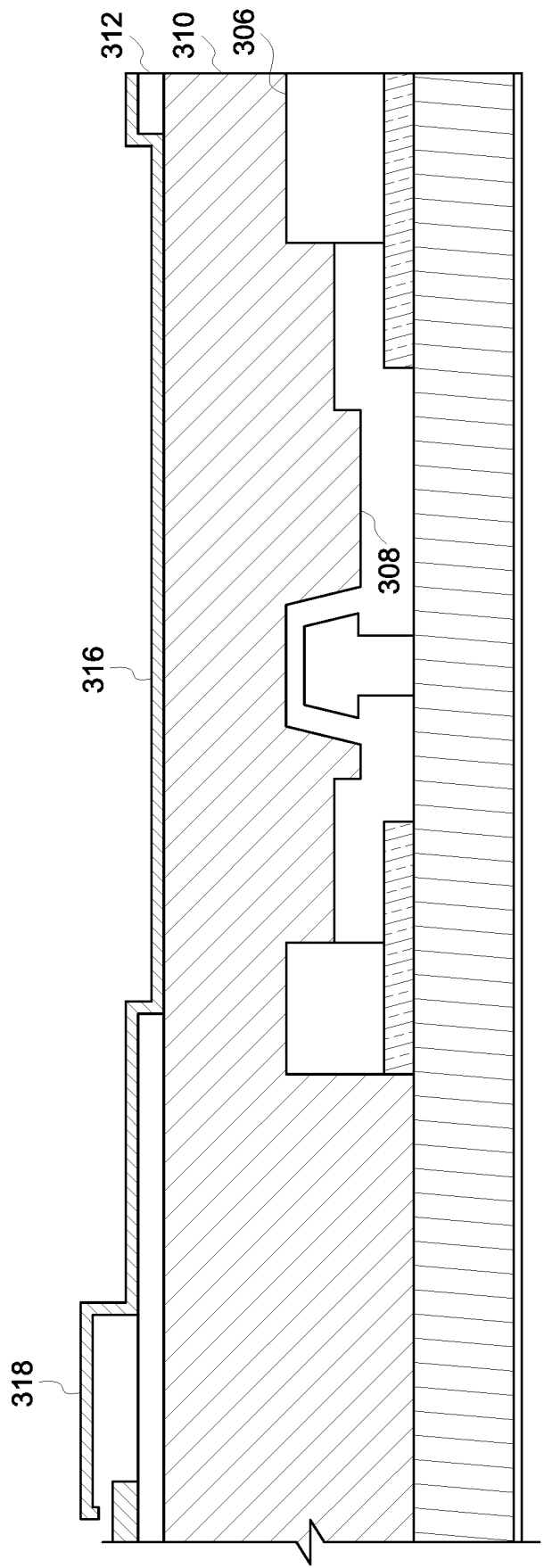

At 210, metal MEMS features 318 are formed on the base 312 of the MEMS device layer as illustrated in FIG. 3F. Metal MEMS features 318 are formed using metal MEMS fabrication techniques. In one example, the metal MEMS features 318 include MEMS switches. For example, the metal MEMS features 318 may include one or more structural and/or functional aspects of, and be formed by one or more processes included in the fabrication of, the RF MEMS devices.

Figure 3G:
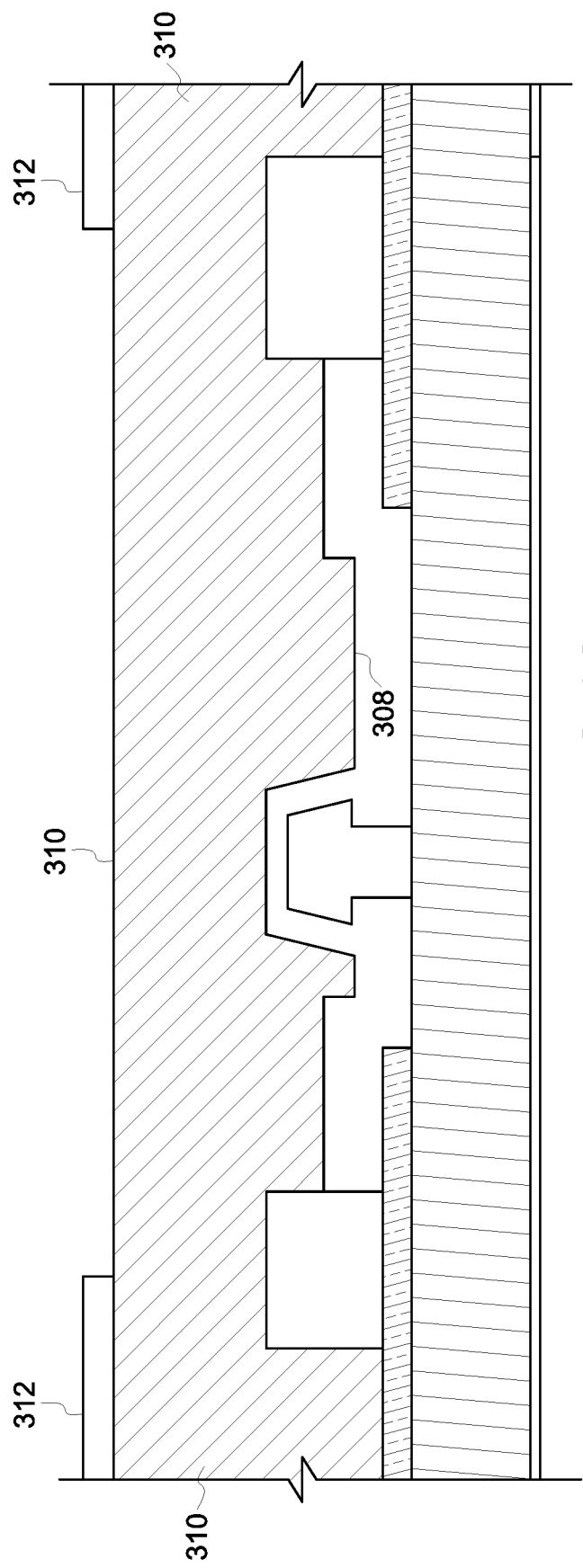

Optionally, the protective layer 316 is removed subsequent to formation of the metal MEMS features 318 as illustrated in FIG. 3G. In one example, the protective layer 316 includes TiW and may be removed by immersion in a selective etchant for TiW (e.g., hydrogen peroxide).

Figure 3H:
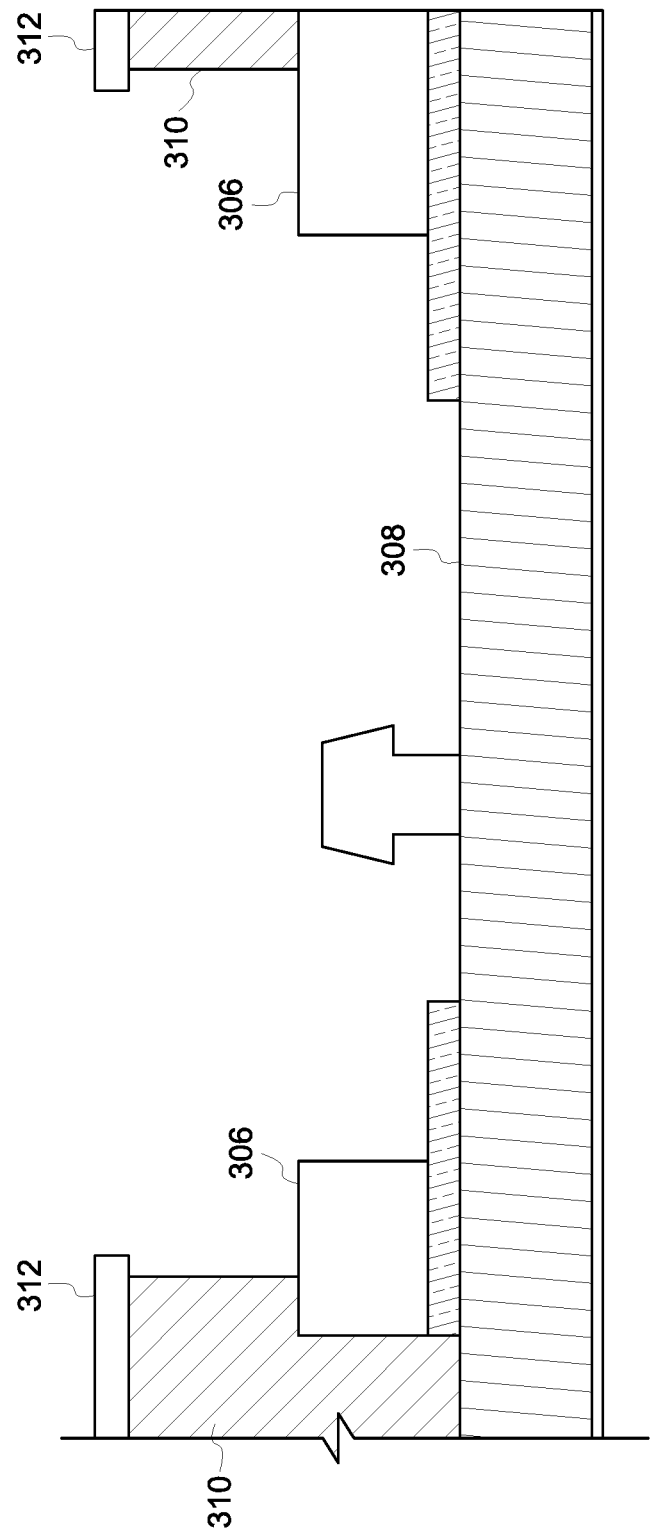

At 212, selected portions of the one or more active feature areas 303 are exposed by selectively removing portions of the conformal overcoat layer 310 that overlay the active feature areas 303 of the active device layer 302 as illustrated in FIG. 3H. Selectively removing portions of the conformal overcoat layer 310 includes selectively etching the conformal overcoat layer 310 in a manner that does not damage underlying portions (e.g., the insulator 309) of the active device layer 302. For example, the conformal overcoat layer 310 is selectively etched using oxygen plasma etching techniques. Oxygen plasma etching techniques may be highly selective so as not to damage the insulator 309 of the active device layer 302 and/or serve to clean the active feature areas 303. Selectively removing portions of the conformal overcoat layer 310 may include forming vias to facilitate electrical contact of the one or more metal MEMS features 318 with the first portions (represented by conductive pads 304A, 304B) of the active feature areas 303 to create a circuit or a portion of a circuit. Additionally or alternatively, substantially the entire portion of the conformal overcoat layer 310 overlaying the active feature areas 303 may be removed.

At 214, conductive contacts 320A, 320B are provided between the conductive pads 304A, 304B of the one or more active feature areas 303 and the associated metal MEMS features 318 to create a circuit or portion of a circuit as illustrated in FIG. 3I.

Optionally, at 216, the MEMS device layer is capped with a cap or barrier layer 112 and the device package 100 is finalized. FIG. 1 illustrates an example of a capped and finalized device package.

Optionally, the one or more APRs may include extrusions of substantially all of each area of the one or more active feature areas of the first surface of the active device layer that extend along a direction that is orthogonal to the first surface of the active device layer to at least the base of the MEMS device layer.

Optionally, the method may include selectively removing portions of the conformal overcoat layer includes etching the conformal overcoat layer using oxygen plasma etching.

Optionally, the method may include forming a protective layer on at least portions of the conformal overcoat layer exposed by removing portions of the base, the protective layer being unaffected by an etchant; and wherein forming the metal MEMS features includes etching the MEMS device layer with the etchant to release the metal MEMS features.

Optionally, the method may include removing the protective layer subsequent to etching the MEMS device layer.

Optionally, the etchant may include hydrofluoric acid or salts thereof.

Optionally, the protective layer may include titanium-tungsten.

Optionally, the method may include wherein the select temperature is greater than temperatures associated with forming the MEMS device layer.

Optionally, the base of the MEMS device layer may include at least one of silicon carbide, silicon nitride, titanium nitride, or polysilicon.

Optionally, the method may include wherein the base of the MEMS device layer includes at least one of a dielectric material or a conductive material.

Optionally, the method may include wherein the dielectric material has an electrical resistance of greater than 100 kOhm/square.

Optionally, the method may include wherein the base is a conductive material, and further comprising removing portions of the conductive material after forming the metal MEMS features.

Optionally, the method may include wherein the one or more active feature areas include circuitry associated with MEMS switches.

Optionally, the method may include forming via holes through the conformal overcoat layer to expose the first portions of each of the one or more active feature areas on the first surface of the active device layer and conductively contacting the first portions through the via holes.

While the present disclosure has been described in terms of one or more particular embodiments, it is apparent that other forms could be adopted by one skilled in the art. It is to be understood that the use of "comprising" in conjunction with the alloy compositions described herein specifically discloses and includes the embodiments wherein the alloy compositions "consist essentially of" the named components (i.e., contain the named components and no other components that significantly adversely affect the basic and novel features disclosed), and embodiments wherein the alloy compositions "consist of" the named components (i.e., contain only the named components except for contaminants which are naturally and inevitably present in each of the named components).

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method comprising:
    obtaining an active device layer having a first surface with one or more active feature areas, the active device layer having first portions of the one or more active feature areas that are exposed on the first surface and second portions of the one or more active feature areas that are covered by an insulating layer;
    forming a conformal overcoat layer on the first surface of the active device layer using a cured polymer;
    forming a base of a microelectromechanical systems (MEMS) device layer on a second surface of the conformal overcoat layer that faces away from the active device layer;
    spatially segregating the MEMS device layer from the one or more active feature areas of the active device layer by removing third portions of the base of the MEMS device layer in one or more antiparasitic regions (APRs) that correspond to the one or more active feature areas;
    forming metal MEMS features on the base of the MEMS device layer; and
    exposing fourth portions of the one or more active feature areas by selectively removing fifth portions of the conformal overcoat layer that overlay the active feature areas of the active device layer.

2. The method of claim 1, wherein the one or more APRs include extrusions of the one or more active feature areas of the first surface of the active device layer that extend along a direction that is orthogonal to the first surface of the active device layer to at least the base of the MEMS device layer.

3. The method of claim 1, wherein the fifth portions of the conformal overcoat layer are removed by etching the conformal overcoat layer using oxygen plasma etching.

4. The method of claim 1, further comprising:
    forming a protective layer on at least sixth portions of the conformal overcoat layer that are exposed by removing seventh portions of the base, the protective layer being unaffected by an etchant; and wherein forming the metal MEMS features includes etching the MEMS device layer with the etchant to release the metal MEMS features.

5. The method of claim 4, further comprising:
    removing the protective layer subsequent to etching the MEMS device layer.

6. The method of claim 4, wherein the etchant includes hydrofluoric acid or a salt thereof.

7. The method of claim 4, wherein the protective layer includes titanium-tungsten.

8. The method of claim 1, wherein the cured polymer of the conformal overcoat layer is stable up to a temperature that is greater than temperatures associated with forming the MEMS device layer.

9. The method of claim 1, the base of the MEMS device layer includes at least one of silicon carbide, silicon nitride, titanium nitride, or polysilicon.

10. The method of claim 1, wherein the base of the MEMS device layer includes a dielectric material.

11. The method of claim 10, wherein the dielectric material has an electrical resistance that is greater than 100 kOhm/square.

12. The method of claim 1, wherein the base of the MEMS device layer includes a conductive material, and further comprising:
    removing sixth portions of the conductive material after forming the metal MEMS features.

13. The method of claim 1, wherein the one or more active feature areas include circuitry associated with MEMS switches.

14. The method of claim 1, further comprising:
    forming via holes through the conformal overcoat layer to expose the first portions of the one or more active feature areas on the first surface of the active device layer; and
    conductively contacting the first portions through the via holes.

* * * * *